United States Patent
Watanabe et al.

(10) Patent No.: US 9,182,625 B2
(45) Date of Patent: Nov. 10, 2015

(54) DISPLAY, MANUFACTURING METHOD THEREFOR AND TRANSPARENT RESIN CHARGING MATERIAL

(75) Inventors: Yuki Watanabe, Tochigi (JP); Yoshihisa Shinya, Tochigi (JP); Kenji Kamiya, Tochigi (JP)

(73) Assignee: Dexerials Corporation, Tokyo (JP)

( * ) Notice: Subject to any disclaimer, the term of this patent is extended or adjusted under 35 U.S.C. 154(b) by 334 days.

(21) Appl. No.: 13/502,252

(22) PCT Filed: Oct. 16, 2009

(86) PCT No.: PCT/JP2009/067921
§ 371 (c)(1),
(2), (4) Date: Jun. 27, 2012

(87) PCT Pub. No.: WO2011/045862
PCT Pub. Date: Apr. 21, 2011

(65) Prior Publication Data
US 2012/0263956 A1  Oct. 18, 2012

(51) Int. Cl.
*B32B 38/10* (2006.01)
*G02F 1/1335* (2006.01)
(Continued)

(52) U.S. Cl.
CPC ........ *G02F 1/133502* (2013.01); *B32B 43/006* (2013.01); *H01J 9/20* (2013.01); *H01J 11/34* (2013.01); *H01J 17/16* (2013.01); *G02F 1/1309* (2013.01); *G02F 2001/133331* (2013.01); *G02F 2202/023* (2013.01); *G02F 2202/28* (2013.01); *G09F 9/30* (2013.01); *H01L 51/524* (2013.01);
(Continued)

(58) Field of Classification Search
CPC ............ B32B 43/006; Y10T 156/1184; Y10T 156/1967; Y10S 156/924; Y10S 156/941

USPC .................................. 156/717, 762, 924, 941
See application file for complete search history.

(56) References Cited

U.S. PATENT DOCUMENTS

| 8,118,075 B2 * | 2/2012 | Sampica et al. ............... 156/762 |
| 8,141,611 B2 * | 3/2012 | Lai et al. ........................ 156/762 |

(Continued)

FOREIGN PATENT DOCUMENTS

| JP | 8-104855 A | 4/1996 |
| JP | 2002-267905 A | 9/2002 |

(Continued)

OTHER PUBLICATIONS

Extended European Search Report dated May 16, 2014 in corresponding European Application No. 09850404.6 (10 pages).

(Continued)

*Primary Examiner* — Mark A Osele
(74) *Attorney, Agent, or Firm* — Osha Liang LLP

(57) ABSTRACT

A display having high re-workability, a method for producing the display, and a transparent resin filler, are provided. A transparent resin filler (5), in which a value obtained on multiplying a hardness of an as-cured resin, expressed as Shore E, with a bonding strength, is not greater than 400, is used as a material of a transparent resin layer (4) to be charged between a picture image display panel (2) and a front side panel (3). In case an undesirable situation, such as mixing of foreign matter in the transparent resin layer (4), has occurred, a re-working member may be moved with ease through a space between the picture image display panel (2) and the front side panel (3) to separate picture image display panel (2) and the front side panel (3) from each other.

5 Claims, 5 Drawing Sheets

(51) Int. Cl.
*B32B 43/00* (2006.01)
*H01J 9/20* (2006.01)
*H01J 11/34* (2012.01)
*H01J 17/16* (2012.01)
*G09F 9/30* (2006.01)
*G02F 1/13* (2006.01)
*G02F 1/1333* (2006.01)
*H01L 51/52* (2006.01)

(52) U.S. Cl.
CPC .......... *H01L 51/5246* (2013.01); *Y10S 156/924* (2013.01); *Y10S 156/941* (2013.01); *Y10T 156/1184* (2015.01); *Y10T 156/1967* (2015.01); *Y10T 428/31551* (2015.04); *Y10T 428/31855* (2015.04)

(56) References Cited

U.S. PATENT DOCUMENTS

| | | | | |
|---|---|---|---|---|
| 8,888,953 | B2* | 11/2014 | Teck | 156/703 |
| 2004/0067329 | A1* | 4/2004 | Okuyama | 428/40.1 |
| 2011/0174445 | A1* | 7/2011 | Ciliberti et al. | 156/752 |
| 2014/0076497 | A1* | 3/2014 | Honda et al. | 156/701 |
| 2014/0196854 | A1* | 7/2014 | Lee et al. | 156/752 |

FOREIGN PATENT DOCUMENTS

| | | |
|---|---|---|
| JP | 2005-249854 A | 9/2005 |
| JP | 2007-191671 A | 8/2007 |
| JP | 2009-025833 A | 2/2009 |
| JP | 2009-161599 A | 7/2009 |
| JP | 2009-186958 A | 8/2009 |
| JP | 2009-186961 A | 8/2009 |
| JP | 2009-186962 A | 8/2009 |
| WO | 2008/007800 A1 | 1/2008 |
| WO | 2008/126893 A1 | 10/2008 |

OTHER PUBLICATIONS

Wikipedia: "Shore Durometer", Mar. 14, 2014, XP002722896 (4 pages).
International Search Report w/translation from PCT/JP2009/067921 dated Jan. 19, 2010 (4 pages).
Chapter II Demand for International Preliminary Examination for PCT/JP2009/067921 dated Jun. 17, 2011 (4 pages).
Reply to Written Opinion with English Translation for PCT/JP2009/067921 filed on Jun. 17, 2011 (11 pages).
International Report on Patentability for PCT/JP2009/067921 dated Aug. 29, 2011 (4 pages).

* cited by examiner

DISPLAY, MANUFACTURING METHOD THEREFOR AND TRANSPARENT RESIN CHARGING MATERIAL

TECHNICAL FIELD

This invention relates to a display including a cured transparent resin layer between a picture image display panel and a front side panel, a manufacturing method therefor, and a transparent resin charging material.

BACKGROUND ART

There has been proposed a display in which a transparent resin filler is charged in a space between the picture image display panel and the front side panel and cured in situ. An optically elastic resin, exhibiting refractive index matching properties, is used as the transparent resin filler to improve viewability and shock-proofness of the display (see for example Patent Publications 1 and 2).

So far, the resin is charged by an inversion method, according to which the resin is applied to one out of the picture image display panel and the front side panel and is allowed to droop on its own, thus without resisting the own gravity. The picture image display panel and the front side panel are bonded together such as to preclude mixing of air bubbles.

There is also known a tilt method according to which one out of the picture image display panel and the front side panel is tilted and the resin is charged in a space thus formed between the two panels. There is further known a gap-dispense method according to which a gap of preset size is provided between the picture image display panel and the front side panel, arranged parallel to each other, with the resin being charged into the gap.

In case the foreign matter, such as air bubbles, are mixed into the bulk of the resin charged between the picture image display panel and the front side panel, a repair operation of separating the two panels apart from each other is carried out before or after curing. See for example Patent Publications 3 and 4. In particular, if the repair operation is carried out after curing the resin, the peel-off strength necessary to peel off the picture image display panel and the front side panel apart from each other increases with the result that picture image display panel and/or the front side panel tends to be damaged. It has thus been desired to improve peel-off re-use performance, that is, so-called re-workability, so that the two panels may readily reliably be peeled off from each other for re-use.

RELATED TECHNICAL DOCUMENTS

Patent Publications

Patent Publication 1: WO2008/007800
Patent Publication 2: WO2008/126893
Patent Publication 3: Japanese Laid-Open Patent Publication 2009-186961
Patent Publication 4: Japanese Laid-Open Patent Publication 2009-186962

SUMMARY OF THE INVENTION

Problem to be Solved by the Invention

In view of the above depicted status of the art, it is an object of the present invention to provide a display having good re-workability, a manufacturing method for the display, and a transparent resin filler.

Means to Solve the Problem

The present inventors have conducted a variety of investigations, and have found that, if a value obtained on multiplying the hardness, expressed as Shore E, with a bonding strength (force of aggregation), is not greater than 400, the peel-off strength necessary to peel off the picture image display panel and the front side panel apart from each other may be decreased, thus providing for improved post-cure re-workability of the resin.

The present invention provides a picture image display including an as-cured transparent resin filler between a picture image display panel and a front side panel, wherein the transparent resin layer has a hardness, expressed as Shore E, of E4/15 to E8/15, with a value obtained on multiplying the hardness with a bonding strength being not greater than 400.

The present invention also provides a method for producing a display comprising the steps of charging a transparent resin filler between a picture image display panel and a front side panel, curing the transparent resin filler to form a transparent resin layer, and causing movement of a re-working member between the picture image display panel and the front side panel to remove the transparent resin layer in case foreign matter has been mixed into the transparent resin layer. The transparent resin layer has a hardness, expressed as Shore E, of E4/15 to E8/15, with a value obtained on multiplying the hardness with a bonding strength being not greater than 400.

The present invention also provides a transparent resin filler for charging between a picture image display panel and a front side panel, wherein the transparent resin layer has a hardness, expressed as Shore E, of E4/15 to E8/15, with a value obtained on multiplying the hardness with a bonding strength being not greater than 400.

It is observed that the hardness, expressed as Shore E, may be obtained by setting an as-cured sample of the transparent resin filler on a type E durometer conforming to JIS K6253 and taking a measured value after 15 seconds as from contact of a pressing needle with the resin.

The bonding strength may be obtained by securing one of the panels, thrusting a lateral edge part of the other panel with a thrust jig, measuring the stress needed until separation of the two panels apart from each other, and by dividing the stress with a unit area.

According to the present invention, the value obtained on multiplying the hardness, expressed as Shore E, of the as-cured resin, is small. Hence, the peel-off strength necessary to peel off the picture image display panel and the front side panel apart from each other is also small, thereby improving the re-workability following the curing of the resin.

BEST MODE FOR CARRYING OUT THE INVENTION

Figure 1:
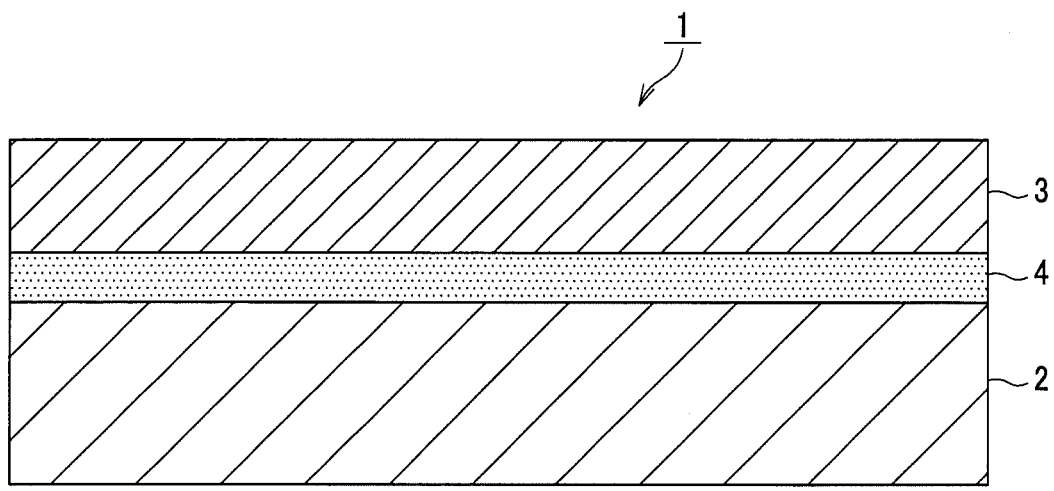
FIG. 1 is a transverse cross-sectional view showing essential portions of a display.

Referring to the drawings, certain concrete embodiments of the present invention will be explained in detail in the following sequence:
1. Display
2. Manufacturing method for the display
3. Examples.

1. Display

FIG. 1 is a transverse cross-sectional view showing essential portions of a display 1. The display includes a picture image display panel 2, a front side panel 3 and a transparent resin layer 4 which is formed by charging a transparent resin filler between the picture image display panel 2 and the front side panel 3 and curing it in situ. There is no particular limitation to the types of the display 1, which may thus be such devices as a liquid crystal display, a mobile phone or a portable game machine, provided that each such device includes a display part.

The picture image display panel 2 is a panel on which a picture image may be displayed, such as, for example, a liquid crystal display panel, a plasma display panel or an organic EL (Electroluminescence Display) sheet that is able to display a picture image thereon. As a surface material of the picture image display panel 2, optical glass or plastics (e.g., acrylic resin) may preferably be used.

The front side panel 3 is a plate-, sheet- or film-shaped member of about the same size as the picture image display panel 2, and is preferably formed of optical glass or plastics, such as acrylic resins, e.g., polymethyl methacrylate (PMMA), or polycarbonate. On the front or back side of the front side panel 3, there may be formed one or more optical layers, such as an anti-reflection film, a light shielding film or a view angle control film.

The transparent resin layer 4 is provided between the picture image display panel 2 and the front side panel 3, and is formed of a transparent resin filler cured in situ. For curing the transparent resin filler, at least one out of heating and illumination of ultraviolet light may be used. It is preferred to use ultraviolet light illumination from the perspective of preventing thermal damage to the picture image display panel 2.

The transparent resin filler of the type curable by illumination of ultraviolet light will now be explained. The transparent resin filler is preferably formed from a photoreactive acrylate material, such as polyurethane acrylate or isobornyl acrylate, and a photopolymerization initiator, as principal reagents.

A resin composition, formed of one or more polymers, one or more acrylate monomers and a photopolymerization initiator, for example, may preferably be used. The polymers may be enumerated by polyurethane acrylate, a polyisoprene acrylate, an esterification product thereof, a terpene-based hydrogenated resin and a butadiene polymer. The acrylate monomers may be enumerated by isobornyl acrylate, dicyclopentenyl oxyethyl methacrylate and 2-hydroxybutyl methacrylate, and the photopolymerization initiator may be 1-hydroxy-cyclohexyl-phenyl-ketone. Other additives, such as sensitizers, plasticizers or transparent particles, for example, may be added insofar as these are amenable to the object of the present invention.

Although there is no particular limitation to the viscosity of the transparent resin filler, it is desirably 500 to 5000 mPa·s and more desirably 500 to 3000 mPa·s from the viewpoint of surface tension and the wet spreading rate.

The refractive index of the as-cured transparent resin filler is determined taking into account the material types of the picture image display panel 2 and/or the front side panel 3. For example, if the surface towards the transparent resin layer 4 of the picture image display panel 2 is formed of optical glass and the surface towards the transparent resin layer 4 of the front side panel 3 is formed of the acrylic resin, such as polymethyl methacrylate, the refractive index of the transparent resin layer 4 is desirably 1.51 to 1.52.

On the other hand, the curing shrinkage of the transparent resin filler, that is, the shrinkage of the as-cured transparent resin filler, is 2.5% or less. It is thus possible to reduce the inner stress, otherwise induced in the transparent resin filler being cured, as well as to prevent distortion from being generated in a boundary surface between the picture image display panel 2 or the front side panel 3 and the transparent resin layer 4. It is observed that the above value of the curing shrinkage is in conformance to the volumetric shrinkage coefficient provided for in JIS K6901 (paragraph 5.12).

The transparent resin layer 4, obtained on curing the transparent resin filler, has the hardness, expressed as Shore E hardness, on the order of E4/15 to E8/15, indicating that shock-proofness or resistance against impact may positively be maintained. The hardness, expressed as Shore E, may be obtained by placing an as-cured sample of the transparent resin filler on a type-E durometer conforming to JIS K6253 and taking a measured value after 15 seconds as from the contact of a pressing needle.

The transparent resin layer 4 also has a bonding strength (force of aggregation) at ambient temperature of ca. 20 to 80 N/cm$^2$. This enables preventing that warping camiot be followed up with, thus causing aggregation destruction. In measuring the bonding strength, one of the panels is secured and a lateral edge of the other panel is thrust with a thrust jig. The maximum value of the stress, that is, the value of the stress when the two panels are separated from each other, is measured. The maximum value of the stress, obtained at the time of separation of the two panels, is divided by a unit area to a bonding strength.

The Shore-E hardness of the transparent resin layer 4, multiplied with a bonding strength (force of aggregation), is 400 or less. If the product of the hardness and the bonding strength exceeds 400, there is fear that damages may be inflicted on the picture image display panel 2 or on the front side panel 3. With the product of the hardness and the bonding strength equal to 400 or less, a re-working member (wire) may be moved with ease through the bulk of the transparent resin layer 4, thus improving the re-workability.

2. Manufacturing Method for a Display

Figure 2:
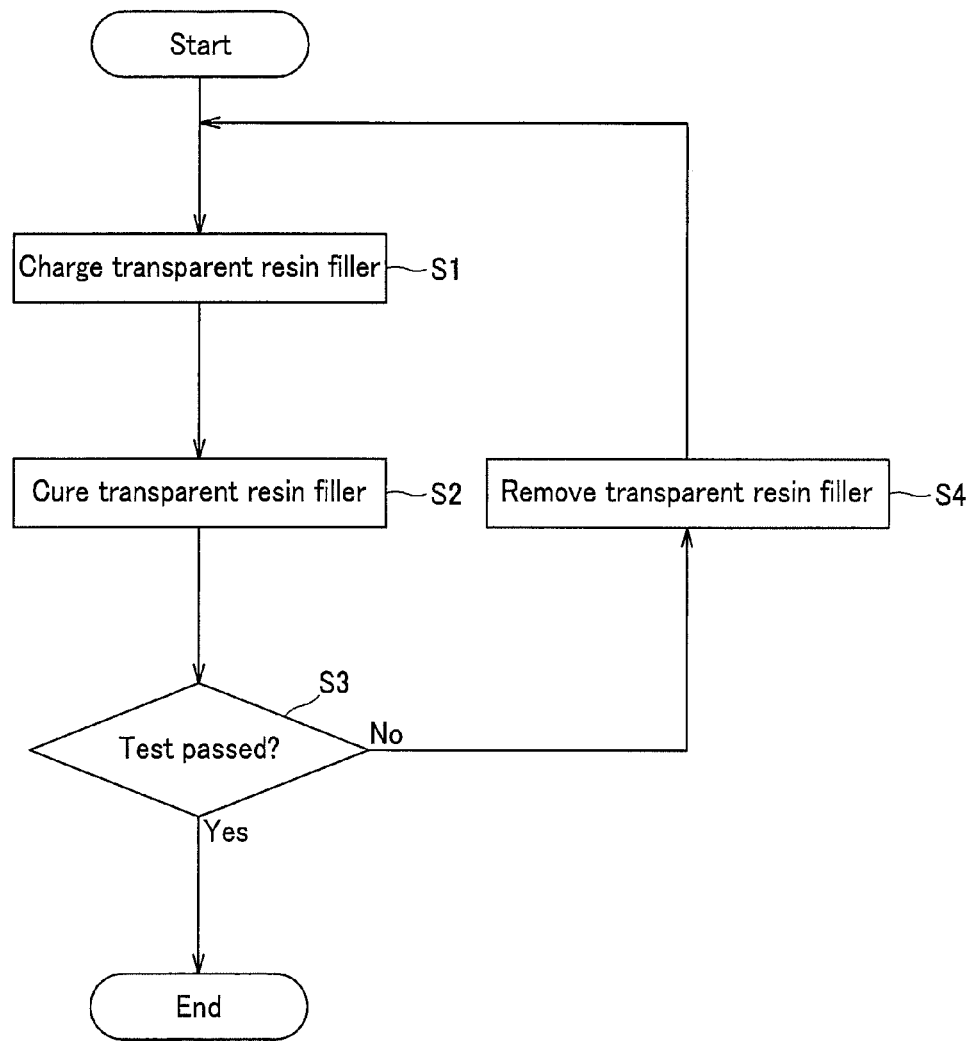
FIG. 2 is a flowchart for illustrating an example method for manufacturing the display.
Figure 3:
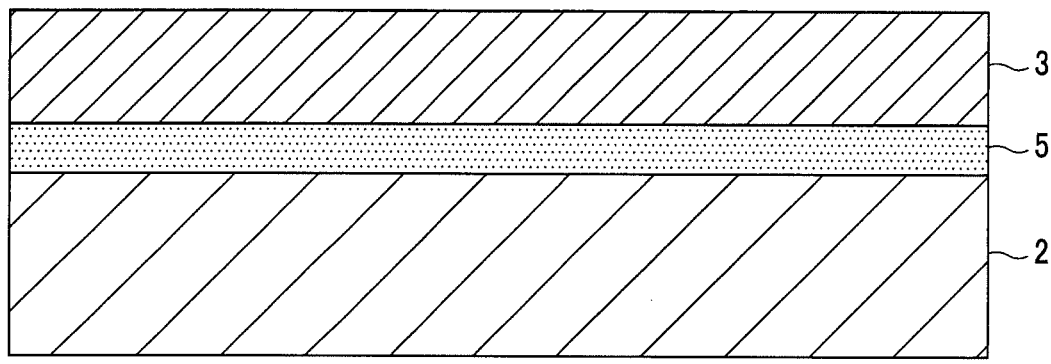
FIG. 3 is a transverse cross-sectional view showing essential portions of the display in the charging step.
Figure 4:
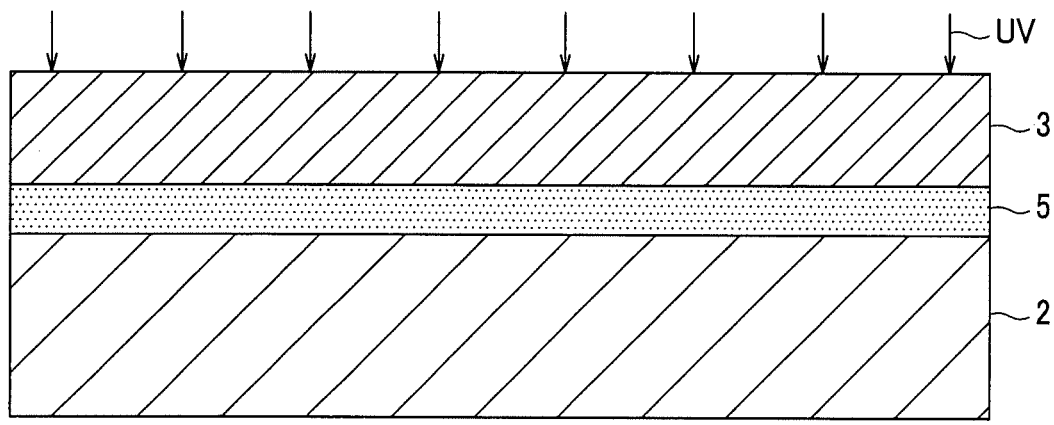
FIG. 4 is a transverse cross-sectional view showing essential portions of the display in the curing step.
Figure 5:
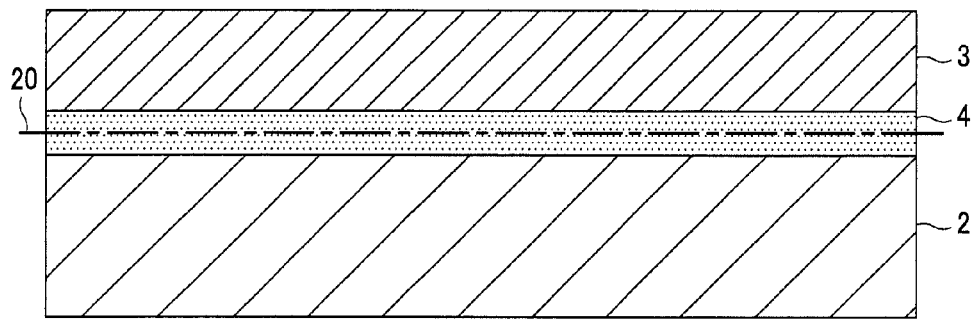
FIG. 5 is a transverse cross-sectional view showing essential portions of the display in the removing step.

A manufacturing method for the above described display will now be explained. FIG. 2 depicts a flowchart showing an example manufacturing method of the display. FIGS. 3 to 5 depict cross-sectional views showing essential portions of the display during different manufacturing process steps, that is, the charging process step, curing process step and the removing process step, respectively. It is observed that the same reference numerals are used to denote the same components as those of the display 1 of FIG. 1, and the corresponding description is dispensed with.

The manufacturing method for the display includes a charging step of charging a transparent resin filler 5 between the picture image display panel 2 and the front side panel 3 (step S1) and a curing step of curing the transparent resin filler 5 to form the transparent resin layer 4 (step S2). The manufacturing method also includes a step of inspecting whether or not there broke out any undesirable situation, such as mixing of foreign matter into the bulk of the transparent resin layer 4 (step S3). The manufacturing method further includes a removing step of causing movement of a re-working member between the picture image display panel 2 and the front side panel 3 to remove the transparent resin layer 4 in case any undesirable situation broke out in the transparent resin layer 4 (step S4).

Initially, during the charging process of the step S1, the transparent resin filler 5 is charged between the picture image display panel 2 and the front side panel 3, as shown in FIG. 3. In charging the transparent resin filler 5, an inversion method, a tilt method or a gap-dispense method may be used. In the inversion method, the transparent resin filler 5 is applied to the picture image display panel 2 or the front side panel 3, and is allowed to droop for itself, that is, by its own gravity. The two panels are then bonded together to charge the transparent resin filler 5 in the space between the panels such as to preclude mixing of air bubbles. In the tilt method, one of the picture image display panel 2 and the front side panel 3 is tilted relative to the other and the transparent resin filler 5 is charged into a space between the panels. In the gap-dispense method, a gap of preset width is maintained between the picture image display panel 2 and the front side panel 3 and the transparent resin filler 5 is dispensed into the gap. Among these charging methods, the gap-dispense method is preferentially used in order to cope with the increasing sizes of the display. Moreover, by using the transparent resin filler 5 with the viscosity of 500 to 3000 mPa·s, it becomes possible to spread the filler under the weight of the picture image display panel 2 or the front side panel 3, as well as to improve the wet spreading rate of the filler.

In the curing process of the step S2, the transparent resin filler 5 is cured to form the transparent resin layer 4. For curing the transparent resin filler 5, at least one out of heating and ultraviolet light illumination may be used. It is preferred to use ultraviolet light illumination from the perspective of preventing thermal damage to the picture image display panel 2. The ultraviolet light curable transparent resin filler 5, mainly composed of the above mentioned photoreactive acrylates, such as polyurethane acrylate or isobornyl acrylate, and the photopolymerization initiator, is used.

Referring to FIG. 4, the ultraviolet (UV) light is illuminated on the transparent resin layer 4, maintained at a preset thickness, via the front side panel 3. To cure the resin uniformly, the ultraviolet light is preferably illuminated from the direction perpendicular to the surface of the front side panel 3. It is desirable to illuminate the UV light from a lateral edge of side of the display 1, using an optical fiber, for example, thereby preventing leakage of the transparent resin filler 5.

In the inspection process of the step S3, it is checked whether or not any foreign matter, such as air bubbles or dust and dirt, has mixed into the transparent resin layer 4 formed between the picture image display panel 2 and the front side panel 3. The inspection may be by visual check with light illumination or by picture image processing. If, in the step S3, the result of the inspection is acceptable, the process is terminated.

If, in the step S3, the foreign matter, such as air bubbles, is intruded into the bulk of the transparent resin layer 4 between the picture image display panel 2 and the front side panel 3 to indicate that an undesirable event broke out, processing transfers to a step S4 to carry out a repair operation of removing the transparent resin layer 4.

In the removal process of the step S4, a re-working member, such as a wire 20, is moved to cut through the transparent resin layer 4 to separate the picture image display panel 2 and the front side panel 3 from each other, as shown in FIG. 5.

Figure 6:
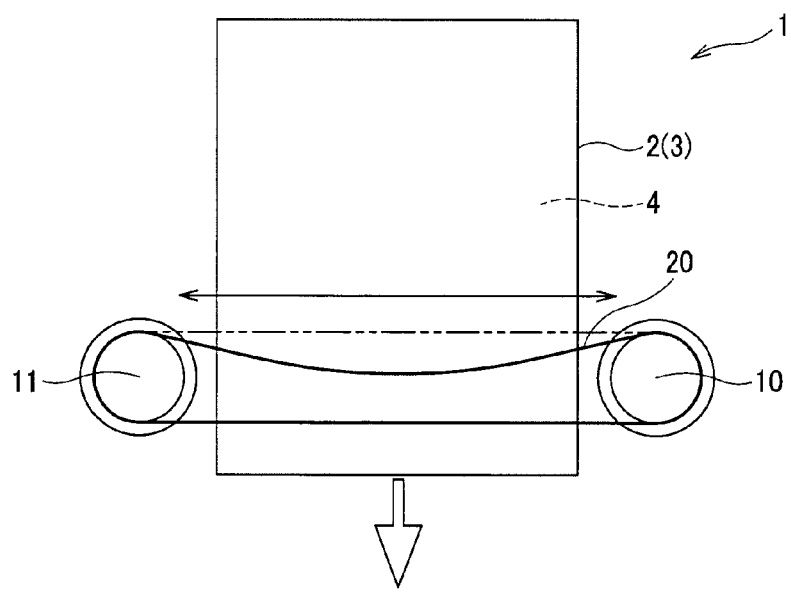
FIG. 6 is a top plan view showing a concrete example 1 of a cut-through device.
Figure 7:
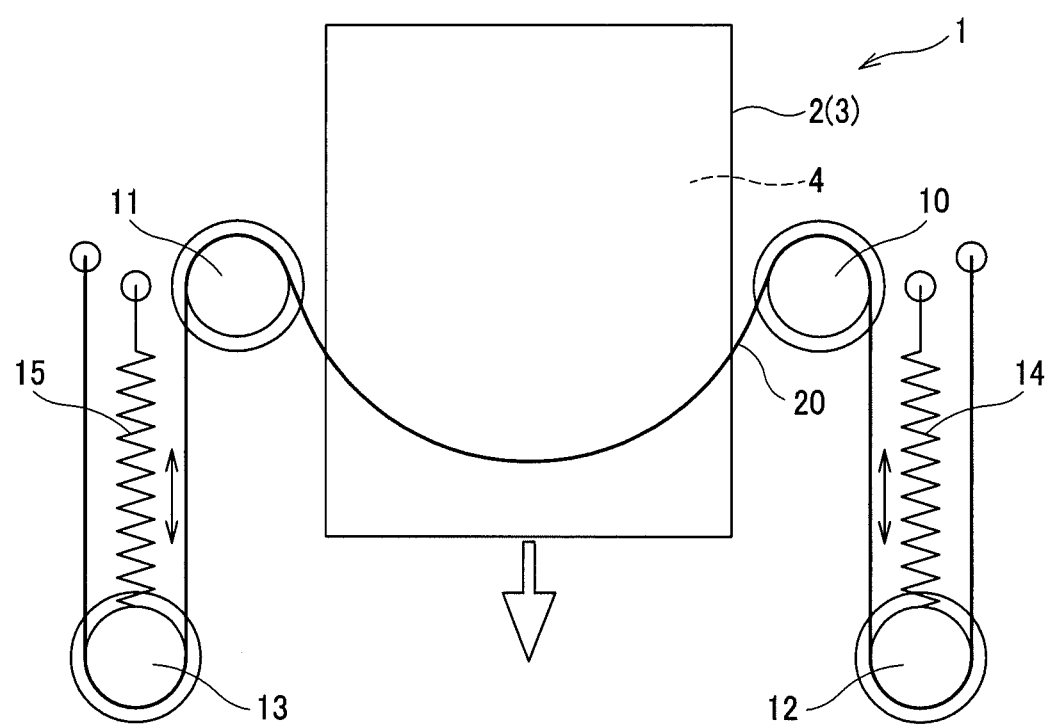
FIG. 7 is a top plan view showing a concrete example 2 of the cut-through device.

FIGS. 6 and 7 show concrete examples of a cut-through device preferably used for cutting through the transparent resin layer. A concrete example 1 of the cut-through device, shown in FIG. 6, includes a wire 20 placed around a pair of pulleys 10, 11. In using the cut-through device, the wire is thrust against the transparent resin layer 4 between the picture image display panel 2 and the front side panel 3, and is slid in the left and right direction in the drawing. In this state, the display 1 is moved in a direction perpendicular to the wire 20. By so doing, the transparent resin layer 4 may be cut through, thereby enabling the picture image display panel 2 and the front side panel 3 to be separated apart from each other.

In a concrete example 2, shown in FIG. 7, the wire 20 is placed on a plurality of pulleys 10 to 13 arranged to constitute two pulley pairs. A pair of tension springs 14, 15 that take up the slack of a portion of the wire 20 situated between the pulleys 10 and 11 are connected to the pulleys 12, 13 operating as the movable pulley pair. In this cut-through device, the transparent resin layer 4 between the picture image display panel 2 and the front side panel 3 is thrust against the wire 20 and, in this state, the display 1 is moved in a direction perpendicular to the wire 20, thereby cutting through the transparent resin layer 4 to separate the picture image display panel 2 and the front side panel 3 from each other. The slack of the portion of the wire 20 between the pulleys 10, 11 is taken up by the elastic force of the tension springs 14, 15, and hence the portion of the wire 20 between the pulleys 10, 11 is maintained at all times in a taut state.

As the wire 20, a metal wire, formed of carbon steel, such as a piano wire, may preferably be used. There is no particular limitation to the thickness of the wire 20 provided that it is lesser than the thickness of the transparent resin layer 4 between the picture image display panel 2 and the front side panel 3. However, for ease in cutting, the wire with a thickness of 50 to 100 μm is mot preferred.

In cutting through the transparent resin layer 4, using the above described cut-through device, the transparent resin filler 5, in which a value corresponding to the product of the hardness, expressed as Shore E, of the as-cured resin, and the bonding strength, is equal to 400 or less, is used, as described above. In this case, the wire 20 may be moved more readily through the bulk of the transparent resin layer 4, thus improving the re-workability. In addition, the cut-through time may be reduced to improve tact time.

After cutting through the transparent resin layer 4, cured resin residues left on the surfaces of the picture image display panel 2 and the front side panel 3 are removed by wipe-off using a removing solution containing an organic solvent. For example, the removing solution is applied to the cured resin by dripping or spraying. The resulting material is allowed to stand for ca. five minutes at ambient temperature to allow the cured resin to be swollen in volume on impregnation. The cured resin residues may then be wiped off using a wipe-off member formed of an elastomer impregnated with the same solvent as the organic solvent of the removing solution applied to the cured resin.

As the organic solvent, contained in the removing solution, limonene ($C_6H_{10}$; solubility parameter: 0.6) or toluene ($C_7H_8$; solubility parameter: 8.8) may, for example, be used. Of these, limonene is preferred as the organic solvent in view of improving safety. It is also possible to add ethyl alcohol or isopropyl alcohol to the removing solution to improve wipe-off performance and volatility.

After removing the transparent resin layer 4 (transparent resin filler 5), the surfaces of the picture image display panel 2 and the front side panel 3 to be wiped are checked by, for example, observing the changes in the surface appearance over a microscope. If there are no residues of cured resins or no surface degradation, processing reverts to the above described step S1 to repeat the process as from the step 1.

Thus, in case an undesirable situation such as mixing of foreign matter into the bulk of the transparent resin layer 4 broke out, the re-working member may be moved with ease between the picture image display panel 2 and the front side panel 3, provided that the transparent resin filler 5, in which the product of the hardness expressed as Shore E of the as-cured resin and the bonding strength is equal to 400 or less, is used. That is, with the product value of the hardness expressed as Shore E of the as-cured transparent resin filler 5 and the bonding strength equal to 400 or less, it becomes possible to readily reliably separate the picture image display panel 2 and the front side panel 3 from each other for re-use, thereby improving the re-workability.

3. Example

The present invention will now be explained more specifically in reference to Examples. In these Examples, evaluation was made of coatability, reliability and re-workability of the resin. It is observed that the present invention is not limited to these Examples.

[Resin 1]

40 parts by weight of an esterification product of a maleic anhydride adduct of a polyisoprene polymer and 2-hydroxyethyl methacrylate (molecular weight: 12500), manufactured by KURARAY Co., Ltd. under the trade name of UC 102, 35 parts by weight of dicyclopenthenyl oxyethylmethacrylate, manufactured by HITACHI CHEMICAL Co., Ltd. under the trade name of FA512M, 3 parts by weight of 2-hydroxypropylacrylate, manufactured by KYOEISHA CHEMICAL Co., Ltd. under the trade name of LIGHT ESTER HOP, 3 parts by weight of acrylomorpholine, manufactured by Kohjin Co. Ltd. under the trade name of ACMO, 15 parts by weight of benzylacrylate, manufactured by OSAKA ORGANIC CHEMICAL INDUSTRY Ltd. under the trade name of C160, 35 parts by weight of a terpene-based hydrogenated resin, manufactured by YASUHARA CHEMICAL Co., Ltd. under the trade name of CLEARON P-85, 120 parts by weight of a butadiene polymer, manufactured by ZEON CORPORATION under the trade name of Polyoil 110, 0.5 part by weight of a photopolymerization initiator, manufactured by Nihon SiberHegner under the trade name of SpeedCure TPO, and 4 parts by weight of a photopolymerization initiator, manufactured by Ciba Specialty Chemicals Holding Inc. under the trade name of irgacure 184D, were kneaded together by a kneader to a resin 2. Table 1 below shows the composition of the above rein 2.

[Resin 2]

50 parts by weight of an esterification product of a maleic anhydride adduct of a polyisoprene polymer and 2-hydroxyethyl methacrylate (molecular weight: 12500), manufactured by KURARAY Co., Ltd. under the trade name of UC 102, 30 parts by weight of dicyclopenthenyl oxyethylmethacrylate, manufactured by HITACHI CHEMICAL Co., Ltd. under the trade name of FA512M, 6 parts by weight of 2-hydroxypropylaciylate, manufactured by KYOEISHA CHEMICAL Co., Ltd. under the trade name of LIGHT ESTER HOP, 10 parts by weight of benzylacrylate, manufactured by OSAKA ORGANIC CHEMICAL INDUSTRY Ltd. under the trade name of C160, 30 parts by weight of a terpene-based hydrogenated resin, manufactured by YASUHARA CHEMICAL Co. Ltd., under the trade name of CLEARON P-85, 130 parts by weight of a butadiene polymer, manufactured by ZEON CORPORATION under the trade name of Polyoil 110, 3.5 parts by weight of a photopolymerization initiator, manufactured by Nihon SiberHegner under the trade name of SpeedCure TPO, and 0.5 part by weight of a photopolymerization initiator, manufactured by Ciba Specialty Chemicals Holding Inc. under the trade name of irgacure 184D, were kneaded together by a kneader to a resin 2. Table 1 below shows the composition of the above rein 2.

[Resin 3]

100 parts by weight of an esterification product of a maleic anhydride adduct of a polyisoprene polymer and 2-hydroxy ethyl methacrylate (molecular weight: 25000), manufactured by KURARAY Co., Ltd. under the trade name of UC 203, 30 parts by weight of dicyclopenthenyl oxyethylmethacrylate, manufactured by HITACHI CHEMICAL Co., Ltd. under the trade name of FA512M, 10 parts by weight of 2-hydroxy propylacrylate, manufactured by KYOEISHA CHEMICAL Co., Ltd. under the trade name of LIGHT ESTER HOP, 30 parts by weight of a terpene-based hydrogenated resin, manufactured by YASUHARA CHEMICAL Co. Ltd. under the trade name of CLEARON P-85, 210 parts by weight of a butadiene polymer, manufactured by ZEON CORPORATION under the trade name of Polyoil 110, 1.5 part by weight of a photopolymerization initiator manufactured by Nihon SiberHegner under the trade name of SpeedCure TPO, and 7 parts by weight of a photopolymerization initiator, manufactured by Ciba Specialty Chemicals Holding Inc. under the trade name of irgacure 184D, were kneaded together by a kneader to a resin 3. Table 1 below shows the composition of the above rein 3.

[Resin 4]

55 parts by weight of an esterification product of a maleic anhydride adduct of a polyisoprene polymer and 2-hydroxyethyl methacrylate (molecular weight: 12500), manufactured by KURARAY Co., Ltd. under the trade name of UC 102, 33 parts by weight of dicyclopenthenyl oxyethyelmethacrylate, manufactured by HITACHI CHEMICAL Co., Ltd. under the trade name of FA512M, 7 parts by weight of 2-hydroxypropylacrylate, manufactured by KYOEISHA CHEMICAL Co., Ltd. under the trade name of LIGHT ESTER HOP, 5 parts by weight of benzyl acrylate, manufactured by OSAKA ORGANIC INDUSTRY Ltd. under the trade name of C160, 30 parts by weight of a terpene-based hydrogenated resin, manufactured by YASUHARA CHEMICAL Co. Ltd., under the trade name of CLEARON P-85, 130 parts by weight of a butadiene polymer, manufactured by ZEON CORPORATION under the trade name of Polyoil 110, 0.5 part by weight of a photopolymerization initiator, manufactured by Nihon SiberHegner under the trade name of SpeedCure TPO, and 4 parts by weight of a photopolymerization initiator, manufactured by Ciba Specialty Chemicals Holding Inc., under the trade name of irgacure 184D, were kneaded together by a kneader to a resin 4. Table 1 below shows the composition of the above rein 4.

[Resin 5]

50 parts by weight of an esterification product of a maleic anhydride adduct of a polyisoprene polymer and 2-hydroxy ethyl methacrylate (molecular weight: 12500), manufactured by KURARAY Co., Ltd. under the trade name of UC 102, 28 parts by weight of dicyclopenthenyl oxyethyelmethacrylate, manufactured by HITACHI CHEMICAL Co., Ltd. under the trade name of FA512M, 7 parts by weight of 2-hydroxy propylacrylate, manufactured by KYOEISHA CHEMICAL Co., Ltd. under the trade name of LIGHT ESTER HOP, 15 parts by weight of benzyl acrylate, manufactured by OSAKA ORGANIC CHEMICAL INDUSTRY Ltd. under the trade name of C160, 56 parts by weight of a terpene-based hydrogenated resin, manufactured by YASUHARA CHEMICAL CO. Ltd. under the trade name of CLEARON P-85, 100 parts by weight of a butadiene polymer, manufactured by ZEON CORPORATION under the trade name of Polyoil 110, 0.5 part by weight of a photopolymerization initiator, manufactured by Nihon SiberHegner under the trade name of SpeedCure TPO, and 4 parts by weight of a photopolymerization initiator, manufactured by Ciba Specialty Chemicals Holding Inc. under the trade name of irgacure 184D, were kneaded together by a kneader to a resin 5. Table 1 below shows the composition of the above rein 5.

[Resin 6]

70 parts by weight of an esterification product of a maleic anhydride adduct of a polyisoprene polymer and 2-hydroxy ethyl methacrylate (molecular weight: 25000), manufactured by KURARAY CO., Ltd. under the trade name of UC 203, 30 parts by weight of dicyclopenthenyl oxyethyelmethacrylate, manufactured by HITACHI CHEMICAL CO., Ltd. under the trade name of FA512M, 10 parts by weight of 2-hydroxypropylacrylate, manufactured by KYOEISHA CHEMICAL CO. Ltd. under the trade name of LIGHT ESTER HOP, 30 parts by weight of a terpene-based hydrogenated resin, manufactured by YASUHARA CHEMICAL CO. Ltd. under the trade name of CLEARON P-85, 140 parts by weight of a butadiene polymer, manufactured by ZEON CORPORATION under the trade name of Polyoil 110, 0.5 part by weight of a photopolymerization initiator, manufactured by Nihon SiberHegner under the trade name of SpeedCure TPO, and 4 parts by weight of a photopolymerization initiator, manufactured by Ciba Specialty Chemicals Holding Inc. under the trade name of irgacure 184D, were kneaded together by a kneader to a resin 3. Table 1 below shows the composition of the above rein 3.

TABLE 1

|  | resin 1 | resin 2 | resin 3 | resin 4 | resin 5 | resin 6 |
| --- | --- | --- | --- | --- | --- | --- |
| UC102 | 40 | 50 | — | 55 | 50 | — |
| UC203 | — | — | 100 | — | — | 70 |
| FA512M | 35 | 30 | 30 | 33 | 28 | 30 |
| HOP | 3 | 6 | 10 | 7 | 7 | 10 |
| ACMO | 3 | — | — | — | — | — |
| C160 | 15 | 10 | — | 5 | 15 | — |
| P-85 | 35 | 30 | 30 | 30 | 56 | 30 |
| Polyoli110 | 120 | 130 | 210 | 130 | 100 | 140 |
| TPO | 0.5 | 3.5 | 1.5 | 0.5 | 0.5 | 0.5 |
| Irg184D | 4 | 0.5 | 7 | 4 | 4 | 4 |
| Total(parts by weight) | 255.5 | 260.0 | 388.5 | 264.5 | 260.5 | 284.5 |

On the transparent resin filler samples (resins 1 to 6), thus prepared, various measurements were made. The following Table 2 shows measured results.

TABLE 2

|  | resin 1 | resin 2 | resin 3 | resin 4 | resin 5 | resin 6 |
| --- | --- | --- | --- | --- | --- | --- |
| viscosity (mPa·s) | 800 | 1100 | 3800 | 1200 | 1300 | 3500 |
| refractive index of cured material | 1.52 | 1.52 | 1.52 | 1.52 | 1.52 | 1.52 |
| curing shrinkage | 1.8 | 1.8 | 1 | 1.8 | 1.8 | 1.8 |
| bonding strength (N/cm$^2$) | 28 | 20 | 35 | 39 | 60 | 50 |
| hardness (Shore-E) | 4 | 8 | 7 | 8 | 7 | 10 |
| bonding strength × hardness | 112 | 160 | 245 | 312 | 420 | 500 |
| peel-off strength (N/15 cm) | Max35 | Max35 | Max40 | Max44 | Max55 | Max55 |

[Measurement of Viscosity]

The viscosity of pre-cure transparent resin filler samples (resins 1~6) was measured at ambient temperature, using a type-E viscosimeter, manufactured by HAAK Inc. under the trade name of Rheometer PK100. It was found that the viscosity of the resin 1 was 800 mPa·s, that of the resin 2 was 1100 mPa·s, that of the resin 3 was 3800 mPa·s, that of the resin 4 was 1200 mPa·s, that of the resin 5 was 1300 mPa·s, and that of the resin 6 was 3500 mPa·s. It was also found that the viscosities of the resins 1, 2, 4 and 5 were such that the resins could be sufficiently spread under the weight of the picture image display panel or the front side panel, and that those of the resins 3, 6 were such that the resins could be sufficiently spread by pressuring the panels together. That is, the resins 1 to 6 were found to exhibit satisfactory coating performance.

[Measurement of Refractive Index of Cured Material]

The refractive indices of the as-cured transparent resin layers (resins 1~6) were measured on an Abbe's refractometer, using the sodium D line at 585 nm at 25° C. It was found that the resins 1~6 all had the refractory index of 1.52.

[Measurement of Curing Shrinkage]

The specific gravity of the pre-cure resin and that of the post-cure resin were measured using an electronic gravimeter manufactured by MIRAGE Inc. under the trade name of SD-120L. Based on the difference between the specific gravity of the pre-cure resin and that of the post-cure resin, the curing shrinkage was calculated in accordance with the equation:

curing shrinkage (%)=(specific gravity of post-cure resin−specific gravity of pre-cure resin)/specific gravity of post-cure resin×100

From the measured results of the refractive index of the cured material and the curing shrinkage, the resins 1 to 6 were found to exhibit sufficient reliability in viewability.

[Measurement of Bonding Strength]

Six transparent resin filler samples (each being of one of the resins 1 to 6), each 5 mm across, were dripped onto center parts of six glass substrates. An acrylic resin substrate was placed over and in parallel with each glass substrate via a spacer 0.1 mm in thickness. The resin filler samples were cured by ultraviolet light to form six test pieces. The acrylic resin test substrates of the test pieces were immobilized. Both end parts of each of the glass substrates that were not in contact with the acrylic resin substrates of the test pieces were thrust by a thrust jig (cross-head) and the stress necessary until the acrylic resin substrate was separated from the glass substrate was measured at ambient temperature. The thrust speed was 5 mm/min. The stress obtained was divided by a unit area to find a bonding strength (force of aggregation). It was found that the bonding strength of the resin 1 was 28 N/cm$^2$, that of the resin 2 was 20 N/cm$^2$, that of the resin 3 was 35 N/cm$^2$, that of the resin 4 was 39 N/cm$^2$, that of the resin 5 was 60 N/cm$^2$ and that of the resin 6 was 50 N/cm$^2$.

[Measurement of Hardness]

The six transparent resin filler samples (each being of one of the resins 1 to 6) were charged into a dedicated vessel and cured with ultraviolet light. Each as-cured resin (sample) was set on the type E durometer conforming to JIS K6253 (ASKAR rubber hardness meter type E manufactured by ASKER-KABUSHIKI KEIKI Co. Ltd.) and the hardness was measured after 15 seconds as from the time of contact of a pressing needle (indentor). Measurement was made at five or more points on the circumference of each sample to calculate an average value. It was found the Shore E hardness of the resin 1 was E4/15, that of the resin 2 was E8/15, that of the resin 3 was E7/15, that of the resin 4 was E8/15, that of the resin 5 was E7/15 and that of the resin 6 was E10/15.

[Bonding Strength×Hardness]

The above mentioned bonding strength (force of aggregation) was multiplied by the hardness expressed as Shore E, and the resulting product value was used as a re-workability parameter. It was found that the product value of the resin 1 was 112, that of the resin 2 was 160, that of the resin 3 was 245, that of the resin 4 was 312, that of the resin 5 was 420 and that of the resin 6 was 500.

[Measurement of the Peel-Off Strength]

Each of six transparent resin filler samples, each being of one of resins 1 to 6, was charged to a thickness of 0.1 mm into a space between a glass substrate and an acrylic resin substrate, both of which are 15 by 26 cm in size. The resulting material was cured with ultraviolet light to a test piece. In peeling off (cutting through) the transparent resin layer of the test piece, 15 cm in width, using a wire, the maximum value of the force (strength) acting on the wire was measured. It was found that a maximum value of the force (strength) of 35 N/15 cm was required to peel off (cut through) the resin layer of the resin 1. In similar manner, it was found that the maximum values of the force (strength) of 35 N/15 cm, 40 N/15 cm, 44 N/15 cm, 55 N/15 cm and 55 N/15 cm were required to peel off the resin layers of the resin 2 to 6, respectively.

It was found that, as the product value obtained on multiplying the bonding strength (force of aggregation) with the hardness, expressed as the Shore E, becomes smaller, the peel-off strength becomes smaller, thus indicating that the two are correlated with each other. Specifically, it was found that, with the resins 1 to 4, with the product value obtained on multiplying the bonding strength (force of aggregation) with the hardness, expressed as the Shore E, being not greater than 400, the peel-off strength becomes smaller, thus leading to improved re-working performance of the as-cured resin.

The invention claimed is:

1. A method for producing a display apparatus comprising:
    charging a transparent resin filler between a picture image display panel and a front side panel;
    curing the transparent resin filler in situ to form a transparent resin layer; and
    causing, when foreign matter has been mixed into the transparent resin layer, movement of a re-working member between the picture image display panel and the front side panel to remove the transparent resin layer;
    wherein the transparent resin layer contains
        (i) an acrylate material including a polyurethane acrylate or an isobornyl acrylate, and
        (ii) a photopolymerization initiator, and
    wherein the transparent resin layer has a hardness, expressed as Shore E, of E4/15 to E8/15, with a value not greater than 400 N/cm$^2$ obtained by multiplying the hardness with a bonding strength.

2. The method of producing a display apparatus according to claim 1, wherein the bonding strength is between 20 and 80 N/cm$^2$.

3. The method of producing a display apparatus according to claim 2, wherein the viscosity of the transparent resin filler is between 500 and 3000 mPa·s.

4. The method of producing a display apparatus according to claim 3, wherein a curing shrinkage, which is a shrinkage of the as-cured transparent resin filler, is not greater than 2.5%.

5. A method for producing a display apparatus comprising:
    charging a transparent resin filler between a picture image display panel and a front side panel;
    curing the transparent resin filler in situ to form a transparent resin layer; and
    causing, when foreign matter has been mixed into the transparent resin layer, movement of a re-working member between the picture image display panel and the front side panel to remove the transparent resin layer,
    wherein the transparent resin layer contains:
        (i) a (meth-)acrylate material selected from the group consisting of a polyurethane acrylate, a polyisoprene acrylate, an esterification product thereof, an isobornyl acrylate, a dicyclopentenyl oxyethyl methacrylate, and 2-hydroxybutyl methacrylate,
        (ii) a polymer selected from the group consisting of a butadiene polymer or a terpene-based hydrogenated resin, and
        (iii) a photopolymerization initiator, and
    wherein the transparent resin layer has a hardness, expressed as Shore E, of E4/15 to E8/15, with a value not greater than 400 N/cm$^2$ obtained by multiplying the hardness with a bonding strength.

* * * * *